(12) United States Patent
Oshins et al.

(10) Patent No.: US 7,155,379 B2
(45) Date of Patent: Dec. 26, 2006

(54) SIMULATION OF A PCI DEVICE'S MEMORY-MAPPED I/O REGISTERS

(75) Inventors: Jacob Oshins, Seattle, WA (US); Brandon Allsop, Monroe, WA (US)

(73) Assignee: Microsoft Corporation, Redmond, WA (US)

( * ) Notice: Subject to any disclaimer, the term of this patent is extended or adjusted under 35 U.S.C. 154(b) by 670 days.

(21) Appl. No.: 10/374,439

(22) Filed: Feb. 25, 2003

(65) Prior Publication Data

US 2004/0236564 A1 Nov. 25, 2004

(51) Int. Cl.
*G06F 13/10* (2006.01)
*G06F 9/44* (2006.01)

(52) U.S. Cl. .............................. 703/21; 703/13; 703/14; 703/17; 703/20; 703/23; 703/24; 710/8; 710/22

(58) Field of Classification Search .................. 703/13, 703/14, 20, 21, 23, 24, 17; 714/25, 733; 710/22, 8
See application file for complete search history.

(56) References Cited

U.S. PATENT DOCUMENTS

| | | | |
|---|---|---|---|
| 6,026,230 A * | 2/2000 | Lin et al. ...................... 703/13 |
| 6,182,242 B1 | 1/2001 | Brogan et al. |
| 6,279,122 B1 | 8/2001 | Hitchcock et al. |
| 6,324,609 B1 | 11/2001 | Davis et al. |
| 6,336,152 B1 | 1/2002 | Richman et al. |
| 6,374,340 B1 | 4/2002 | Lanus et al. |
| 6,418,485 B1 | 7/2002 | Cooper et al. |
| 6,442,514 B1 * | 8/2002 | Le ............................... 703/21 |
| 6,484,227 B1 | 11/2002 | Mergard et al. |
| 6,484,281 B1 * | 11/2002 | Wang et al. ................. 714/733 |
| 6,499,074 B1 | 12/2002 | Mehta et al. |
| 6,629,157 B1 * | 9/2003 | Falardeau et al. ............ 710/10 |
| 6,748,461 B1 * | 6/2004 | Oshins et al. .................. 710/8 |
| 6,810,442 B1 * | 10/2004 | Lin et al. ...................... 710/22 |
| 6,820,219 B1 * | 11/2004 | Huang et al. ................. 714/25 |
| 6,980,944 B1 * | 12/2005 | Oshins et al. ................. 703/17 |
| 2003/0149962 A1 * | 8/2003 | Willis et al. ................ 717/135 |

OTHER PUBLICATIONS

"PCISIM A Simulation Tool for PCI Bus Based Systems", R. Sharp, User's Manual, Dec. 1999.*

(Continued)

*Primary Examiner*—Fred Ferris
(74) *Attorney, Agent, or Firm*—Amin, Turocy, & Calvin, LLP (57) ABSTRACT

A component, system and method for simulation of a PCI device's memory-mapped I/O register(s) are provided. The PCI simulation component has an initialization component, a configuration space simulator and a memory-mapped I/O space simulator. The initialization component can claim an amount of memory by modifying the amount of memory that an operating system has available to it. The initialization component further identifies to the operating system that at least some of the claimed memory resides on a PCI bus. The configuration space simulator causes the operating system to accept that the simulated PCI device is present in the system. The memory-mapped I/O space simulator simulates device and can comprise can comprise a thread that monitors the simulated memory-mapped I/O registers for a change in order to simulate behavior of the simulated PCI device. Additionally and/or alternatively, the memory-mapped I/O space simulator can comprise a thread that changes at least one of the simulated memory mapped I/O registers in order to simulate behavior of the simulated PCI device.

19 Claims, 7 Drawing Sheets

OTHER PUBLICATIONS

"An Integrated Approach to PCI Subsystem Verification in SOC's", D. Duxstad, EETimes, 2000.*

"PCI Device Compliance Testing Using a Mixed C-Verilog Environment", D. Duxstad et al.*

"A Design Modleing and Simulation Methodology for PCI-X Subsystems", M. Cases et al, IEEE 0-7803-6450-3/00, 2000 IEEE.*

PCI-SIG, PCI Local Bus Specification Revision 3.0, Aug. 12, 2002, 1-344, PCI-SIG, Portland, OR.

Yan Shoumeng, et al.; "A Simulation Framework for Device Driver Development"; Northwestern Polytechnical University; Dec. 2002; 4 Pages.

* cited by examiner

SIMULATION OF A PCI DEVICE'S MEMORY-MAPPED I/O REGISTERS

TECHNICAL FIELD

The present invention relates generally to PCI device(s), and, more particular to simulation of a PCI device's memory-mapped I/O register(s).

BACKGROUND OF THE INVENTION

The Peripheral Component Interface (PCI) bus is a high performance 32-bit or 64-bit bus with multiplexed address and data lines. The bus is intended for use as an interconnect mechanism between highly integrated peripheral controller components, peripheral add-in cards, and processor/memory systems. PCI is a widely accepted and implemented expansion standard.

Hardware vendors of PCI device(s) have pressure from the computer marketplace to have software in place as PCI device(s) become available. This has traditionally lead to limited time and/or ability to debug software for the PCI device(s). Additional problem(s) can occur when the PCI device(s) require infrastructure from operating system(s). The introduction of Personal Computer Memory Card International Association (PCMCIA) standard for cards inserted into the side of laptop computers, Universal Serial Bus (USB) standard, and Bluetooth standard for wireless communication are examples of situations in which hardware device(s) were introduced with little or no operating system infrastructure facilitating interconnection.

SUMMARY OF THE INVENTION

The following presents a simplified summary of the invention in order to provide a basic understanding of some aspects of the invention. This summary is not an extensive overview of the invention. It is not intended to identify key/critical elements of the invention or to delineate the scope of the invention. Its sole purpose is to present some concepts of the invention in a simplified form as a prelude to the more detailed description that is presented later.

The present invention provides for a PCI simulation component comprising an initialization component, a configuration space simulator and a memory-mapped I/O space simulator. The PCI simulation component facilitates simulation of PCI device(s) (e.g., hardware) thus reducing difficulties with traditional method(s) of developing software for PCI device(s). Conventionally, it has been difficult to create software (e.g., device driver(s)) for new PCI device(s) until the actual PCI device(s) were available. This resulted in significant period(s) of time during which hardware was physically available but not available for use by computer system(s). Hardware-level simulators for PCI device(s) exist; however, cost(s) associated with the hardware-level simulators can be prohibitive. The present invention can significantly reduce cost(s) associated with PCI device simulation.

The PCI simulation component claims an amount of memory from a computer system. The PCI simulation component then identifies to an operating system at least some of the claimed memory as residing on a PCI bus. Thereafter, the PCI simulation component identifies the simulated PCI device to the operating system. The PCI simulation component further simulates behavior of a simulated PCI device, thus, permitting development and/or testing of a device driver associated with the simulated PCI device. The present invention can thus significantly reduce the amount of time during which a PCI device is available without software support (e.g., device driver(s) associated with the PCI device).

In accordance with an aspect of the present invention, the PCI simulation component simulates aspect(s) of a simulated PCI device, for example, those which are visible to software in the memory-mapped I/O space. The PCI simulation component further simulates the configuration space for the simulated PCI device.

The initialization component performs initialization for the PCI simulation component. The initialization component claims an amount of memory from a computer system. The initialization component can accomplish this by modifying the amount of memory that the operating system has available to it. By claiming some of the memory for itself, the initialization component can then operate on that memory without colliding with the operating system. This can be necessary, for example, since the operating system generally attempts to enforce a separation between address space used by device(s) (e.g., PCI device(s)) and that used by main memory.

In one example, the initialization component claims an amount of memory by reducing an amount of memory available to the operating system. At least some of the claimed memory is then utilized by the configuration space simulator and/or the memory-mapped I/O space simulator. For example, the initialization component can provide information to the operating system's boot file causing the operating system kernel's memory manager to stop using the portion for use by the PCI simulation component (e.g., add/MAXMEM as an argument in a boot.ini file.)

The initialization component further identifies to the operating system that at least some of the claimed memory resides on a PCI bus. In one example, this identification can be based, at least in part, upon modification of an Advance Configuration and Power Interface specification ("ACPI") Basic Input/Output System ("BIOS") Differentiated System Description Table ("DSDT") in order to represent at least some of the claimed memory as being part of a root of a PCI bus hierarchy. In another example, this identification can be based, at least in part, upon a filter driver that modifies a resource requirement reported by a root PCI bus hierarchy to include at least some of the claimed memory. In yet a third example, this identification can be based, at least in part, upon modification of a BIOS description of memory. In yet a fourth example, this identification can be based, at least in part, upon modification of the memory that the operating system uses by passing arguments to a kernel of the operating system.

Once the initialization component has taken control of at least some of the claimed memory and caused the operating system to accept that it resides on a PCI bus, the configuration space simulator then causes the operating system to accept that the simulated PCI device is present in the system (e.g., the configuration space simulator identifies the simulated PCI device to the operating system). Identification of the simulated PCI device to the operating system can be based, at least in part, upon simulation of contents of PCI configuration space associated with the simulated PCI device.

The configuration space simulator can hook functions in the operating system that read and write configuration space. Thus, when a PCI driver in the operating system scans the PCI bus, the configuration space simulator can provide data that convinces the PCI driver that the simulated PCI device is present in the system. Since the information stored in the configuration space for the PCI device also contains registers that control which part of the memory-mapped I/O space the device uses, the configuration space simulator can pre-populate those (virtual) registers with the physical address of the claimed memory of which it has taken control. Thus, simulation of contents of PCI configuration space can include populating at least one base register with an address associated with the claimed memory (e.g., claimed memory acting as simulated memory-mapped I/O register(s) of the simulated PCI device).

Thereafter, the PCI driver can communicate to a Plug and Play manager that the simulated PCI device has been added to the system. The PCI driver can also communicate to the Plug and Play manager that the simulated PCI device is using the address space that claimed memory. This causes the Plug and Play manager to load a device driver associated with the simulated PCI device. Thus, the PCI simulation component facilitates testing/development of the simulated PCI device, for example, before the actual hardware (PCI device) is available.

The memory-mapped I/O space simulator simulates behavior of a simulated PCI device. The memory-mapped I/O space simulator can comprise a thread that monitors the simulated memory-mapped I/O registers (e.g., in the claimed memory) for a change in order to simulate behavior of the simulated PCI device. Additionally and/or alternatively, the memory-mapped I/O simulator can comprise a thread that changes at least one of the simulated memory mapped I/O registers (e.g., in the claimed memory) in order to simulate behavior of the simulated PCI device.

Thus, the memory-mapped I/O space simulator can continually scan the memory looking for changes that the device driver associated with the simulated PCI device makes to the simulated memory-mapped registers (e.g., in the claimed memory). The memory-mapped I/O space simulator can also write change(s) into the memory that will be perceived by the device driver of the simulated PCI device as change(s) in the simulated PCI device's hardware state. Using these technique(s), the memory-mapped I/O space simulator can virtually create some and/or substantially all of the activity of an actual PCI device.

To the accomplishment of the foregoing and related ends, certain illustrative aspects of the invention are described herein in connection with the following description and the annexed drawings. These aspects are indicative, however, of but a few of the various ways in which the principles of the invention may be employed and the present invention is intended to include all such aspects and their equivalents. Other advantages and novel features of the invention may become apparent from the following detailed description of the invention when considered in conjunction with the drawings.

DETAILED DESCRIPTION OF THE INVENTION

The present invention is now described with reference to the drawings, wherein like reference numerals are used to refer to like elements throughout. In the following description, for purposes of explanation, numerous specific details are set forth in order to provide a thorough understanding of the present invention. It may be evident, however, that the present invention may be practiced without these specific details. In other instances, well-known structures and devices are shown in block diagram form in order to facilitate describing the present invention.

As used in this application, the term "computer component" is intended to refer to a computer-related entity, either hardware, a combination of hardware and software, software, or software in execution. For example, a computer component may be, but is not limited to being, a process running on a processor, a processor, an object, an executable, a thread of execution, a program, and/or a computer. By way of illustration, both an application running on a server and the server can be a computer component. One or more computer components may reside within a process and/or thread of execution and a component may be localized on one computer and/or distributed between two or more computers. A "thread" is the entity within a process that the operating system kernel schedules for execution. As is well known in the art, each thread has an associated "context" which is the volatile data associated with the execution of the thread. A thread's context includes the contents of system registers and the virtual address belonging to the thread's process. Thus, the actual data comprising a thread's context varies as it executes.

Figure 1:
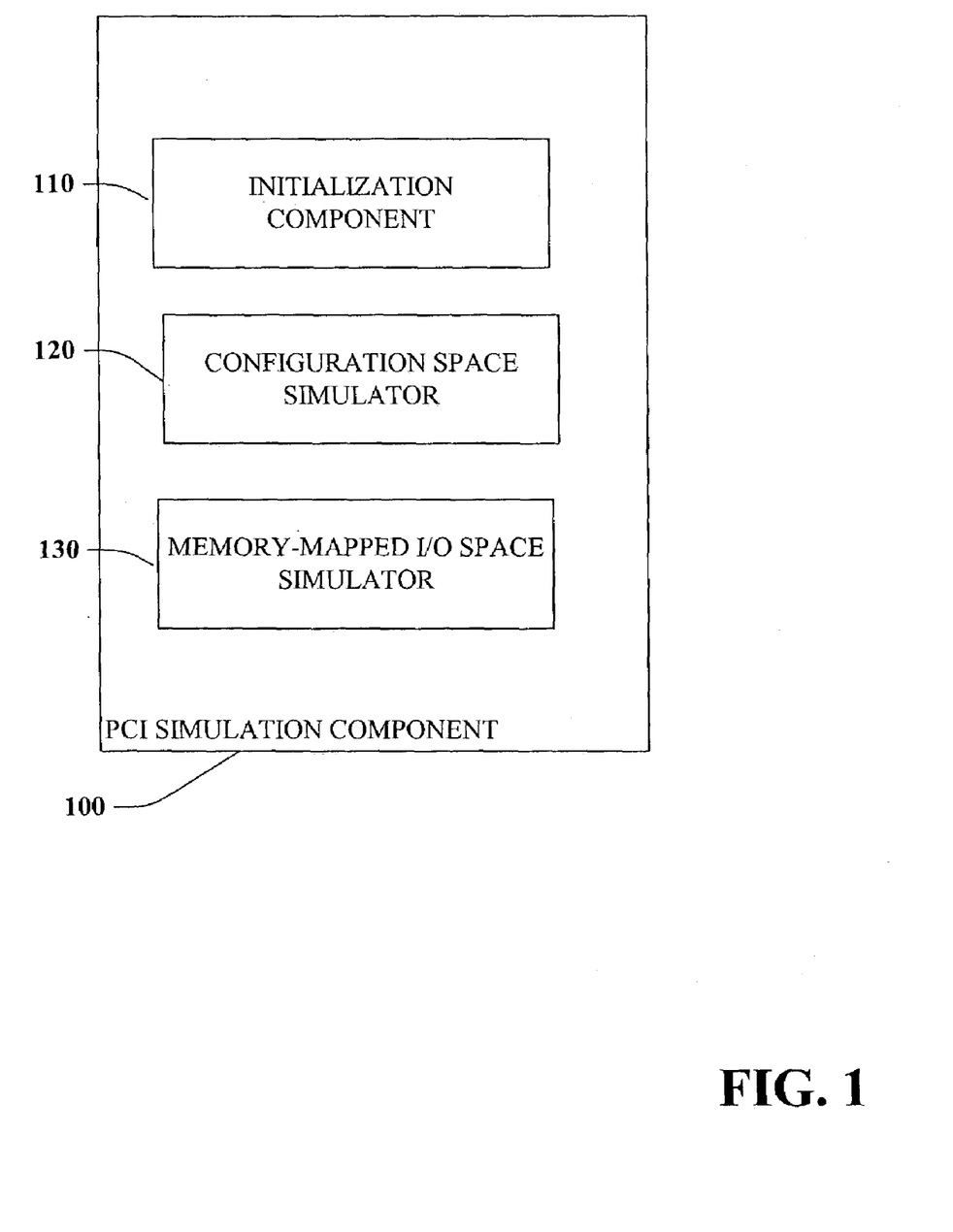
FIG. 1 is a block diagram of a PCI simulation component in accordance with an aspect of the present invention.

Referring to FIG. 1, a PCI simulation component 100 in accordance with an aspect of the present invention is illustrated. The PCI simulation component 100 comprises an initialization component 110, a configuration space simulator 120 and a memory-mapped I/0 space simulator 130.

The PCI simulation component 100 facilitates simulation of PCI device(s) (e.g., hardware) thus reducing difficulties with traditional method(s) of developing software for PCI device(s). Conventionally, it has been difficult to create software (e.g., device driver(s)) for new PCI device(s) until the actual PCI device(s) were available. This resulted in significant period(s) of time during which hardware was physically available but not available for use by computer system(s).

The PCI simulation component 100 claims an amount of memory from a computer system (not shown). The PCI simulation component 100 then identifies to an operating system (not shown) at least some of the claimed memory as residing on a PCI bus. Thereafter, the PCI simulation component 100 identifies the simulated PCI device to the operating system. The PCI simulation component 100 further simulates behavior of a simulated PCI device, thus, permitting development and/or testing of a device driver (not shown) associated with the simulated PCI device (not shown). The present invention can thus significantly reduce the amount of time during which a PCI device is available without software support (e.g., device driver(s) associated with the PCI device).

PCI device(s) typically implement three address spaces: I/O, memory-mapped I/0 and configuration. "I/O space" can correspond, for example, to an I/O space of an Intel-brand processor. "Configuration space" is used generally for setting up the PCI device.

"Memory-mapped I/O space" can involve a PCI device which has control register(s) in address space traditionally addressed as memory. While the control register(s) are addressed as "memory", the value(s) written and read from a particular control register can be different, as distinguished from memory (e.g., RAM) which generally returns the same value that was last written. For example, for a complicated device such as a USB controller, the control register(s) don't just store previously written values—a bit can have meaning (e.g., one bit can indicate that a USB port is active while another bit can enable the port.).

In accordance with an aspect of the present invention, the PCI simulation component 100 simulates aspect(s) of a simulated PCI device, for example, those which are visible to software in the memory-mapped I/O space. The PCI simulation component 100 further simulates the configuration space for the simulated PCI device. Thus, the PCI simulation component 100 of the present invention can employ memory and software to simulate the behavior of a PCI device's memory-mapped register(s).

The initialization component 110 performs initialization for the PCI simulation component 100. The initialization component 110 claims an amount of memory from a computer system (not shown). For example, the initialization component 100 can accomplish this by modifying the amount of memory that the operating system has available to it. By claiming some of the memory for itself, the initialization component can then operate on that memory without colliding with the operating system. This can be necessary, for example, since the operating system generally attempts to enforce a separation between address space used by device(s) (e.g., PCI device(s)) and that used by main memory.

Figure 2:
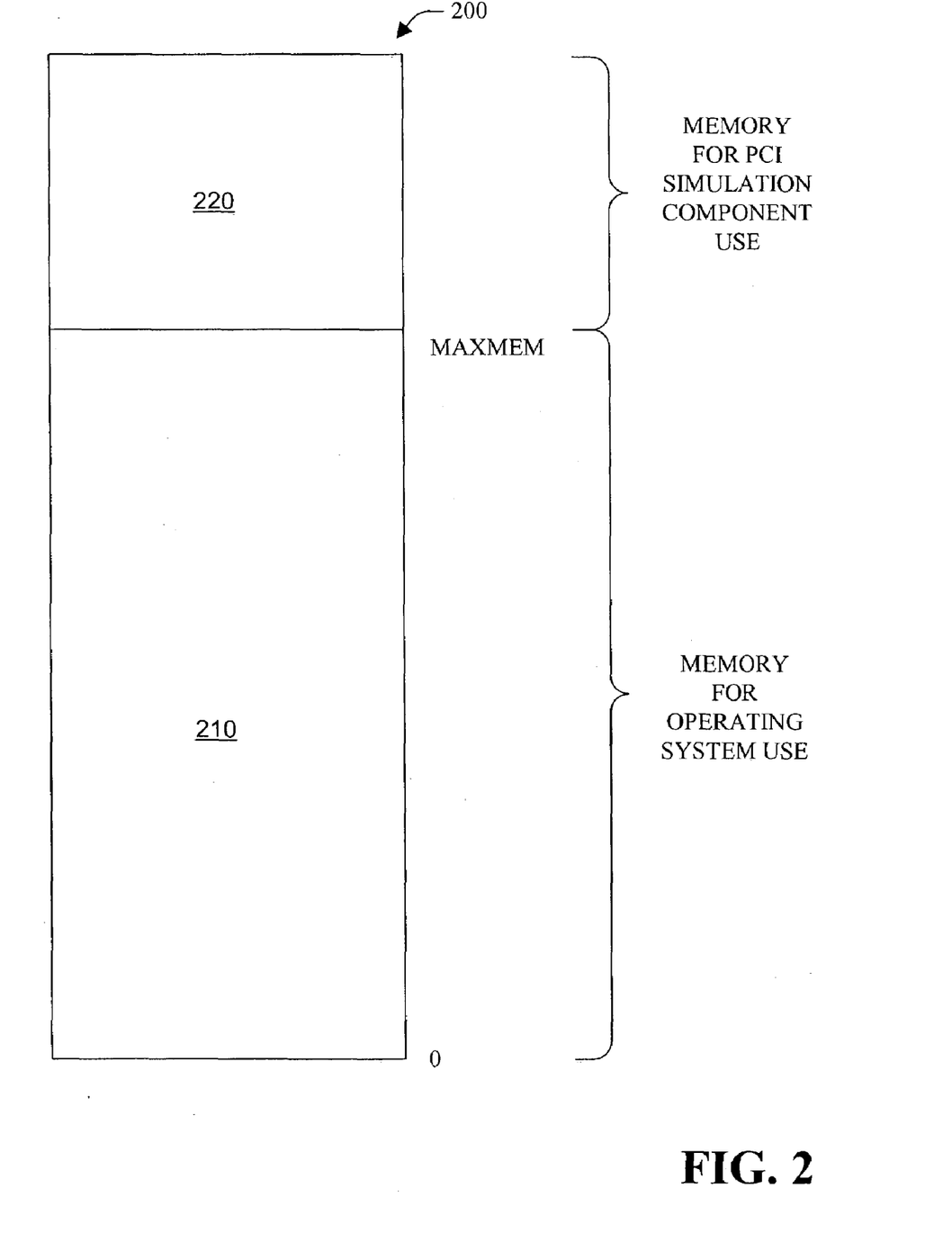
FIG. 2 is a block diagram of an exemplary memory in accordance with an aspect of the present invention.

In one example, the initialization component 110 claims an amount of memory by reducing an amount of memory available to the operating system. At least some of the claimed memory is then utilized by the configuration space simulator 120 and/or the memory-mapped I/O space simulator 130. Referring briefly to FIG. 2, an exemplary memory 200 in accordance with an aspect of the present invention is illustrated. The memory 200 comprises a portion for use by the operating system 210 and a portion for use by the PCI simulation component 220 (e.g., PCI simulation component 100). For example, the initialization component 110 can provide information to the operating system's boot file causing the operating system kernel's memory manager to stop using the portion for use by the PCI simulation component 220 (e.g., add/MAXMEM as an argument in a boot.ini file.)

Referring back to FIG. 1, the initialization component 110 further identifies to the operating system that at least some of the claimed memory resides on a PCI bus. In one example, this identification can be based, at least in part, upon modification of an Advance Configuration and Power Interface specification ("ACPI") Basic Input/Output System ("BIOS") Differentiated System Description Table ("DSDT") in order to represent at least some of the claimed memory as being part of a root of a PCI bus hierarchy. In another example, this identification can be based, at least in part, upon a filter driver that modifies a resource requirement reported by a root PCI bus hierarchy to include at least some of the claimed memory. In yet a third example, this identification can be based, at least in part, upon modification of a BIOS description of memory. In yet a fourth example, this identification can be based, at least in part, upon modification of the memory that the operating system uses by passing arguments to a kernel of the operating system.

Once the initialization component 110 has taken control of at least some of the claimed memory and caused the operating system to accept that it resides on a PCI bus, then the configuration space simulator 120 can cause the operating system to accept that the simulated PCI device is present in the system (e.g., the configuration space simulator 120 identifies the simulated PCI device to the operating system). Identification of the simulated PCI device to the operating system can be based, at least in part, upon simulation of contents of PCI configuration space associated with the simulated PCI device (e.g., by the configuration space simulator 130).

The configuration space simulator 120 can hook functions in the operating system that read and write configuration space. Thus, when a PCI driver (not shown) in the operating system scans the PCI bus, the configuration space simulator 120 can provide data that convinces the PCI driver that the simulated PCI device is present in the system. Since the information stored in the configuration space for the PCI device also contains registers that control which part of the memory-mapped I/O space the device uses, the configuration space simulator 120 can pre-populate those (virtual) registers with the physical address of the claimed memory of which it has taken control. Thus, simulation of contents of PCI configuration space can include populating at least one base register with an address associated with the claimed memory (e.g., claimed memory acting as simulated memory-mapped I/O register(s) of the simulated PCI device).

Figure 3:
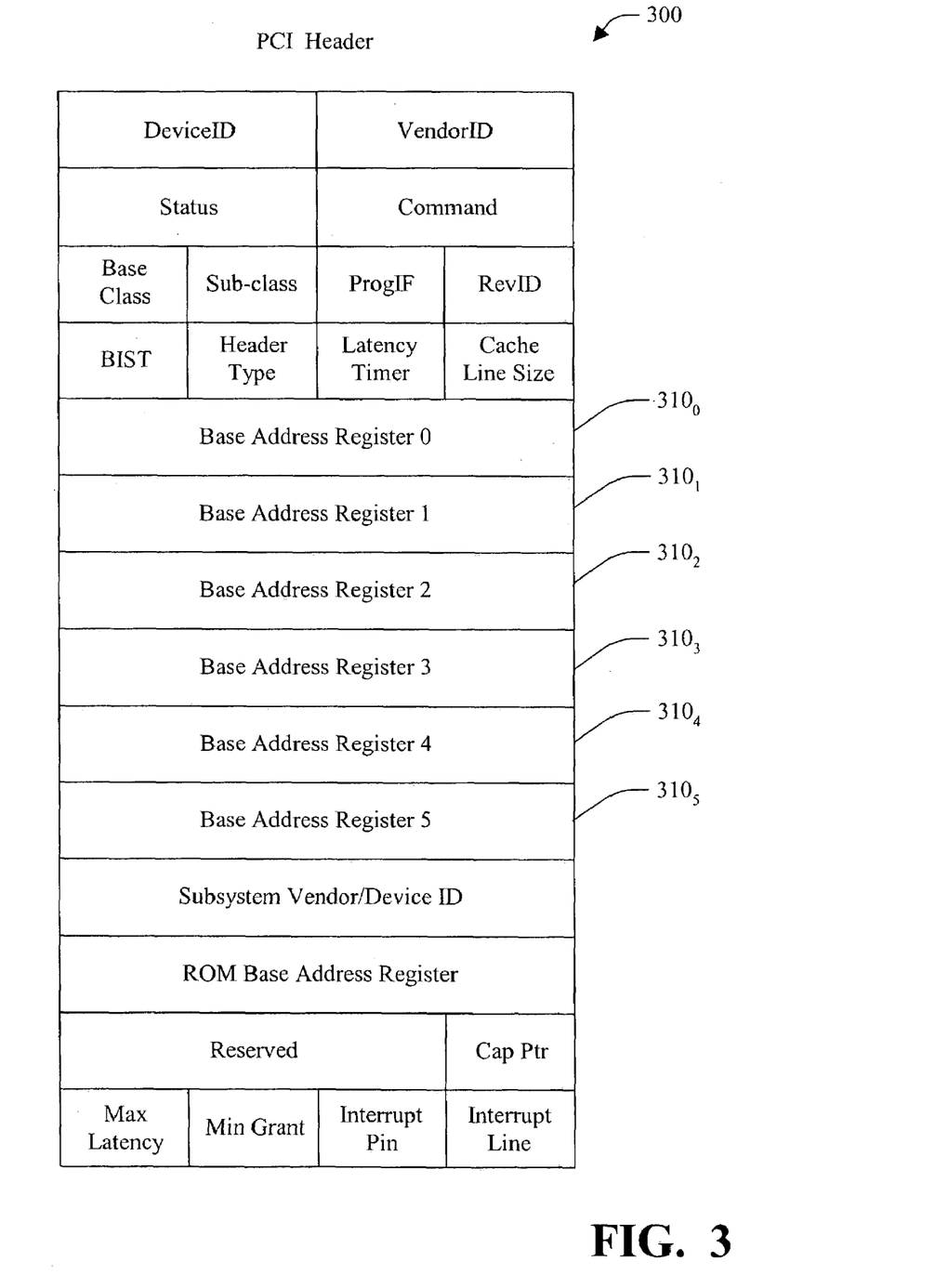
FIG. 3 is a block diagram of an exemplary PCI header in accordance with an aspect of the present invention.

For example, referring briefly to FIG. 3, an exemplary PCI header 300 in accordance with an aspect of the present invention is illustrated. The header 300 includes a plurality of fields including Base Address Register 0 $310_0$, Base Address Register 1 $310_1$, Based Address Register 2 $310_2$, Base Address Register 3 $310_3$, Base Address Register 4 $310_4$ and Based Address Register 5 $310_5$, collectively referred to as Base Address Registers 310. One or more of the Base Address Registers 310 can include a pointer to the claimed memory.

Returning to FIG. 1, thereafter, the PCI driver can communicate to a Plug and Play manager (not shown) that the simulated PCI device has been added to the system. The PCI driver can also communicate to the Plug and Play manager that the simulated PCI device is using the address space backed by the claimed memory. This causes the Plug and Play manager to load a device driver associated with the simulated PCI device (not shown). Thus, the PCI simulation component 100 facilitates testing/development of the simulated PCI device, for example, before the actual hardware (PCI device) is available.

The memory-mapped I/O space simulator 130 simulates behavior of a simulated PCI device. The memory-mapped I/O space simulator 130 can comprise a thread that monitors the simulated memory-mapped I/O registers (e.g., in the claimed memory) for a change in order to simulate behavior of the simulated PCI device. Additionally and/or alternatively, the memory-mapped I/O space simulator 130 can comprise a thread that changes at least one of the simulated memory mapped I/O registers (e.g., in the claimed memory) in order to simulate behavior of the simulated PCI device.

Thus, the memory-mapped I/O space simulator 130 can continually scan the memory looking for changes that the device driver associated with the simulated PCI device makes to the simulated memory-mapped registers (e.g., in the claimed memory). The memory-mapped I/O space simulator 130 can also write change(s) into the memory that will be perceived by the device driver of the simulated PCI device as change(s) in the simulated PCI device's hardware state. Using these technique(s), the memory-mapped I/O space simulator 130 can virtually create some and/or substantially all of the activity of an actual PCI device.

For example, the process of directing a simulated PCI device's memory-mapped I/O ranges toward system RAM allows the device driver for the simulated device to access that RAM as it would real device register(s), since both the RAM and the actual device (which doesn't exist yet) exist in Memory Address Space. The same operating system primitives for reading, writing and/or mapping that memory will work.

While FIG. 1 is a block diagram illustrating components for the PCI simulation component 100, it is to be appreciated that the PCI simulation component 100, the initialization component 110, the configuration space simulator 120 and/or the memory-mapped I/O space simulator 130 can be implemented as one or more computer components, as that term is defined herein. Thus, it is to be appreciated that computer executable components operable to implement the PCI simulation component 100, the initialization component 110 and/or the memory-mapped I/O space simulator 130 can be stored on computer readable media including, but not limited to, an ASIC (application specific integrated circuit), CD (compact disc), DVD (digital video disk), ROM (read only memory), floppy disk, hard disk, EEPROM (electrically erasable programmable read only memory) and memory stick in accordance with the present invention.

Figure 4:
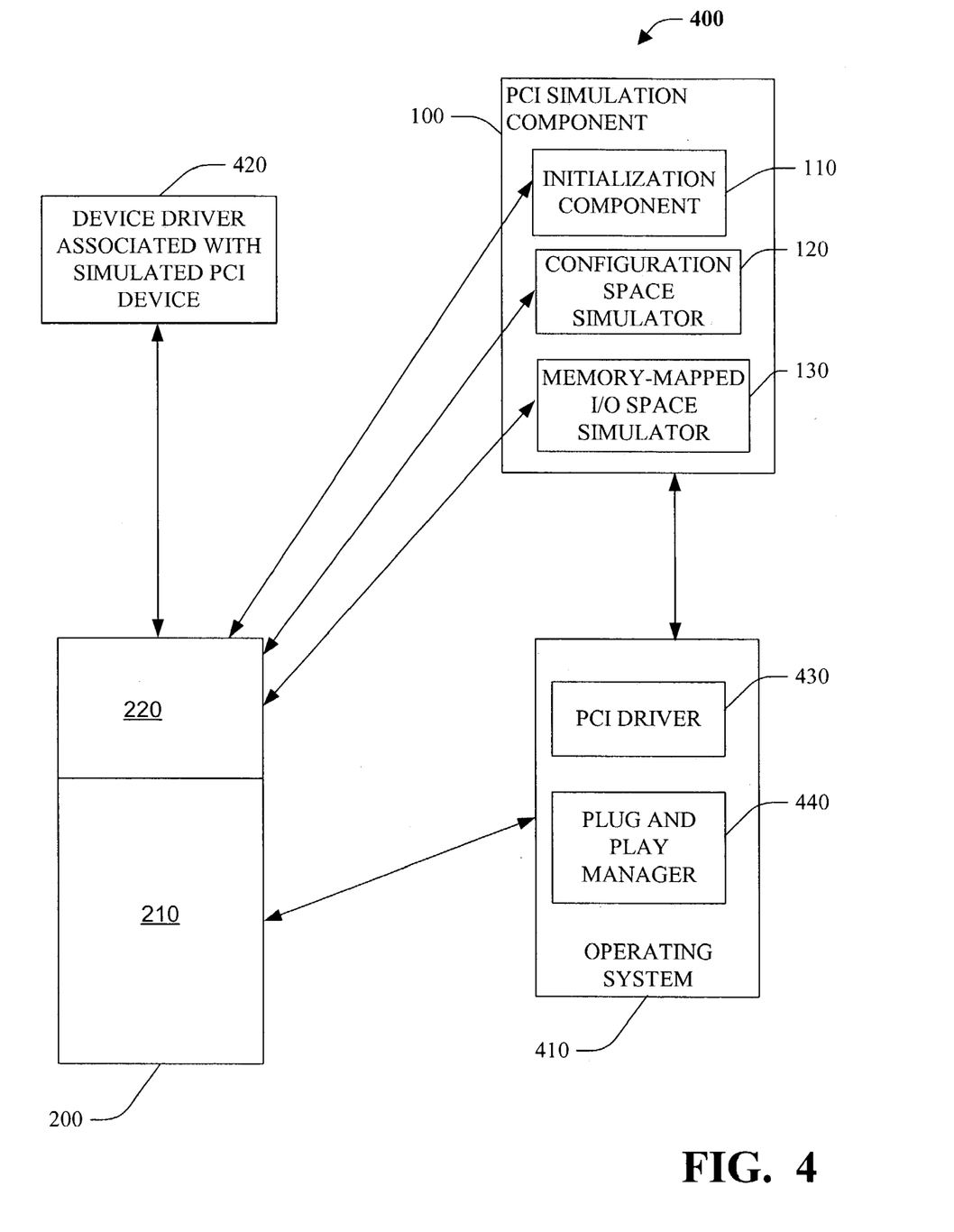
FIG. 4 is a block diagram of a PCI simulation system in accordance with an aspect of the present invention

Turning to FIG. 4, a PCI simulation system 400 in accordance with an aspect of the present invention is illustrated. The system 400 includes a PCI simulation component 100, memory 200 and an operating system 410. Optionally, the system 400 can include a device driver associated with a simulated PCI device 420. The system 400 facilitates simulation of PCI device(s) (e.g., hardware), for example, prior to availability of the actual PCI device(s).

As discussed supra, the PCI simulation component 100 comprises an initialization component 110, a configuration space simulator 120 and a memory-mapped I/O space simulator 130. The PCI simulation component 100 claims an amount of memory 200—the claimed memory 220. The PCI simulation component 100 then identifies to the operating system 410 at least some of the claimed memory 220 as residing on a PCI bus. Thereafter, the PCI simulation component 100 identifies the simulated PCI device to the operating system 410. The PCI simulation component 100 further simulates behavior of a simulated PCI device, thus, permitting development and/or testing of the device driver associated with the simulated PCI device 420. The present invention can thus significantly reduce the amount of time during which a PCI device is available without software support (e.g., device driver associated with the PCI device 420).

The PCI simulation component 100 simulates aspect(s) of a simulated PCI device and the configuration space for the simulated PCI device. Thus, the PCI simulation component 100 of the present invention can employ memory and software to simulate the special behavior of a PCI device's memory-mapped register(s).

Once the PCI simulation component 100 has taken control of the claimed memory 220 and caused the operating system 410 to accept that it resides on a PCI bus, then it must cause the operating system 410 to accept that the simulated PCI device is present in the system (e.g., the PCI simulation component 100 identifies the simulated PCI device to the operating system 410). Identification of the simulated PCI device to the operating system can be based, at least in part, upon simulation of contents of PCI configuration space associated with the simulated PCI device (e.g., by the configuration space simulator 120). The configuration space simulator 120 of the PCI simulation component 100 can hook functions in the operating system 410 that read and write configuration space. Thus, when a PCI driver 430 in the operating system 410 scans the PCI bus, the configuration space simulator 120 can provide data that convinces the PCI driver 430 that the simulated PCI device is present in the system. Since the information stored in the configuration space for the device also contains the registers that control which part of the memory-mapped I/O space the device uses, the configuration space simulator 120 can pre-populate those (virtual) registers with the physical address of the memory of which it has taken control. Thus, simulation of contents of PCI configuration space can include populating at least one base register with an address associated with the claimed memory (e.g., claimed memory acting as simulated memory-mapped I/O register(s) of the simulated PCI device).

Thereafter, the PCI driver 430 can communicate to a Plug and Play manager 440 that the simulated PCI device has been added to the system. The PCI driver 430 can also communicate to the Plug and Play manager 440 that the simulated PCI device is using the address space that claimed memory. This causes the Plug and Play manager 440 to load the device driver associated with the simulated PCI device 420. Thus, the system 400 facilitates testing/development of the simulated PCI device, for example, before the actual hardware (PCI device) is available.

The memory-mapped I/O space simulator 130 of the PCI simulation component 100 simulates behavior of a simulated PCI device. The memory-mapped I/O space simulator 130 can comprise a thread that monitors the simulated memory-mapped I/O registers in the claimed memory 220 for a change in order to simulate behavior of the simulated PCI device. Additionally and/or alternatively, the memory-mapped I/O space simulator 130 can comprise a thread that changes at least one of the simulated memory mapped I/O registers in the claimed memory 220 in order to simulate behavior of the simulated PCI device.

Thus, the memory-mapped I/O space simulator 130 can continually scan the claimed memory 220 looking for changes that the device driver associated with the simulated PCI device 420 makes to the simulated memory-mapped registers in the claimed memory 220. The memory-mapped I/O space simulator 130 can also write change(s) into the claimed memory 220 that will be perceived by the device driver of the simulated PCI device 420 as change(s) in the simulated PCI device's hardware state. Using these technique(s), the memory-mapped I/O space simulator 130 can virtually create some and/or substantially all of the activity of an actual PCI device.

It is to be appreciated that the system 400, the operating system 410, the device driver associated with a simulated PCI device 420, the PCI driver 430 and/or the Plug and Play manager 440 can be computer components as that term is defined herein.

Figure 5:
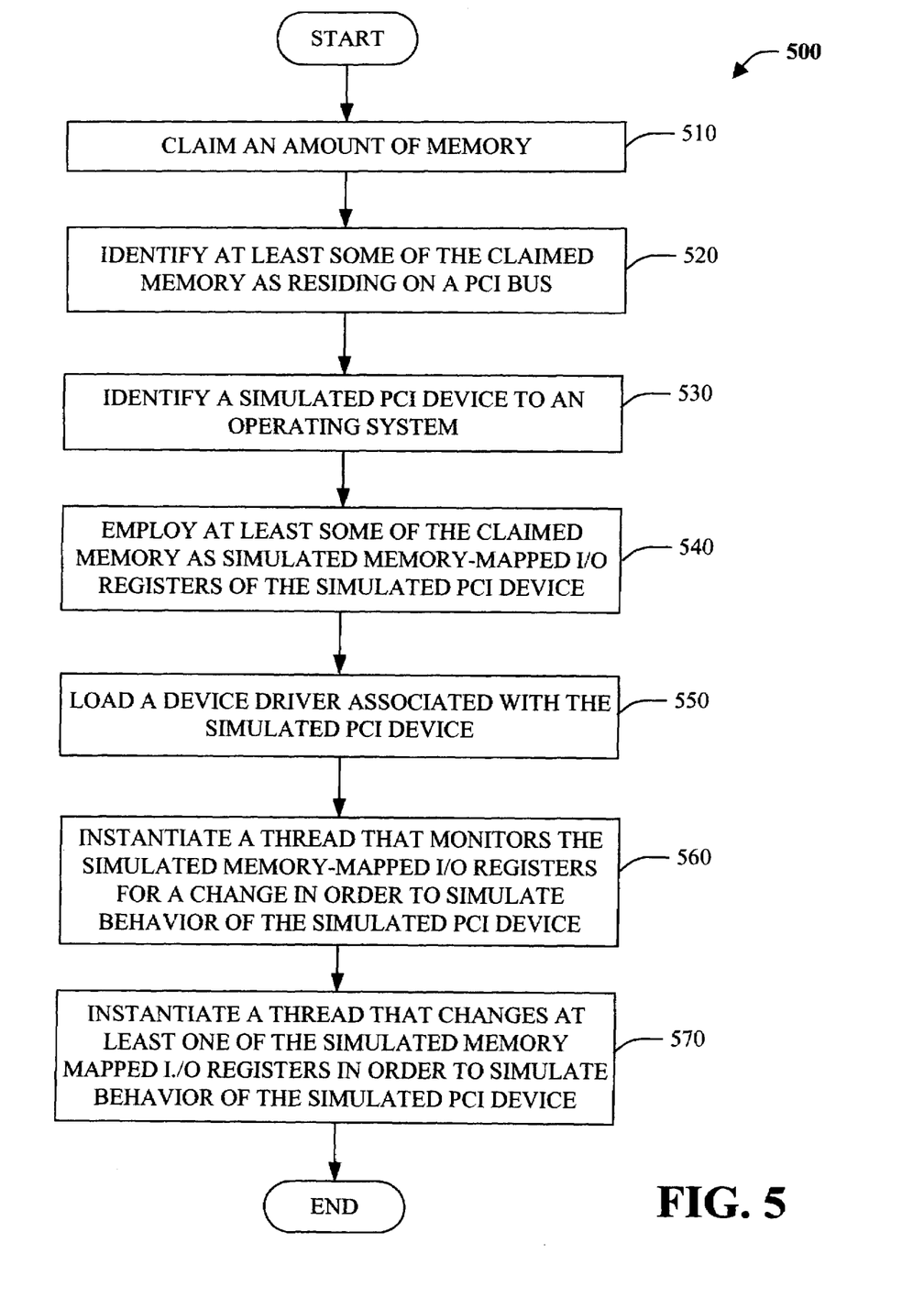
FIG. 5 is a flow chart of a method of simulation of a PCI device's memory-mapped I/O registers in accordance with an aspect of the present invention.
Figure 6:
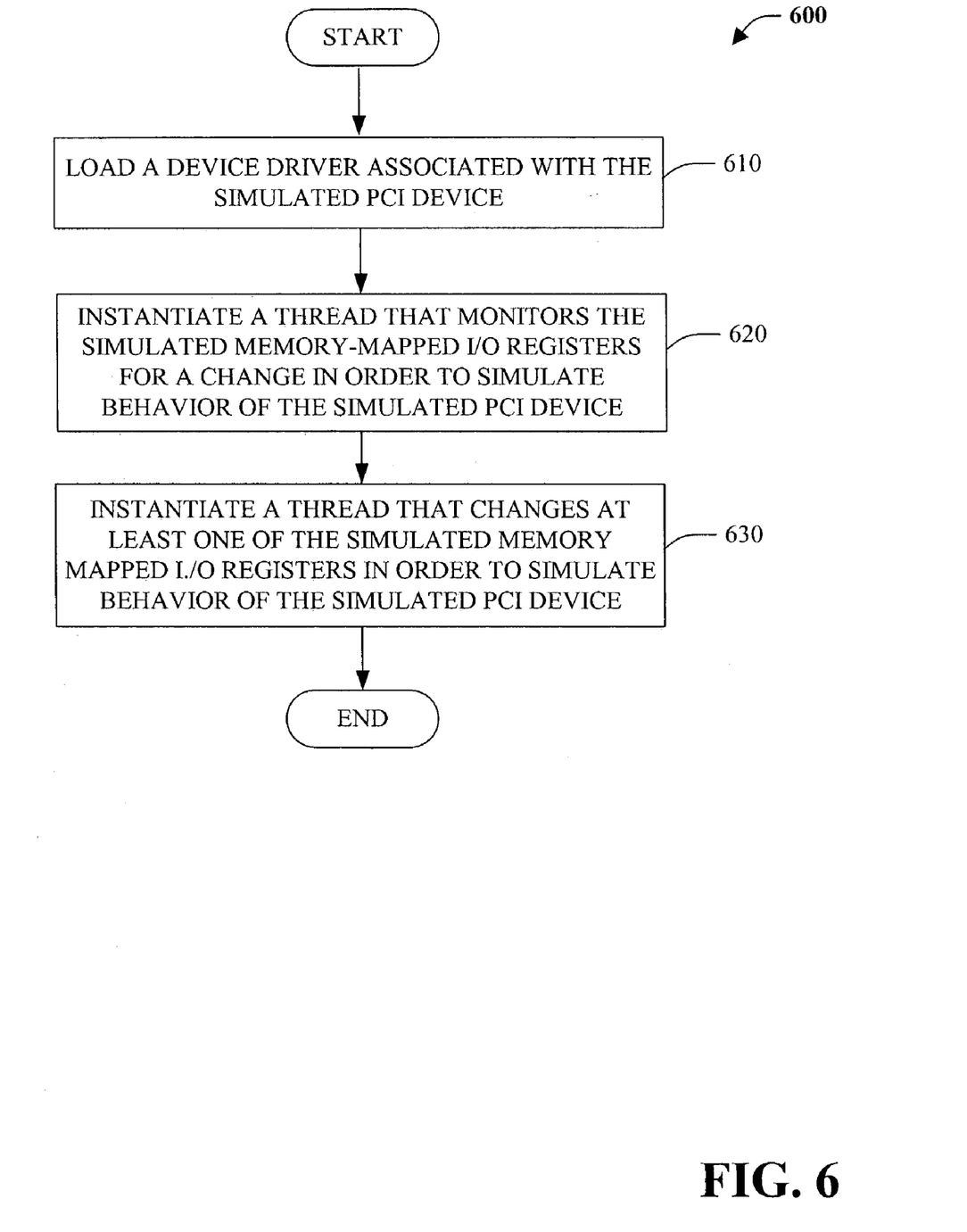
FIG. 6 is a flow chart of a method for a PCI device simulation in accordance with an aspect of the present invention.

Turning briefly to FIGS. 5 and 6, methodologies that may be implemented in accordance with the present invention are illustrated. While, for purposes of simplicity of explanation, the methodologies are shown and described as a series of blocks, it is to be understood and appreciated that the present invention is not limited by the order of the blocks, as some blocks may, in accordance with the present invention, occur in different orders and/or concurrently with other blocks from that shown and described herein. Moreover, not all illustrated blocks may be required to implement the methodologies in accordance with the present invention.

The invention may be described in the general context of computer-executable instructions, such as program modules, executed by one or more components. Generally, program modules include routines, programs, objects, data structures, etc. that perform particular tasks or implement particular abstract data types. Typically the functionality of the program modules may be combined or distributed as desired in various embodiments.

Referring to FIG. 5, a method of simulation of a PCI device's memory-mapped I/O registers 500 in accordance with an aspect of the present invention is illustrated. At 510, an amount of memory is claimed (e.g., by a PCI simulation component 100). For example, claiming the amount of memory can include reducing an amount of memory available to the operating system.

At 520, at least some of the claimed memory is identified as residing on a PCI bus (e.g., by an initialization component 110). For example, identification of at least some of the claimed memory as residing on a PCI bus can be based, at least in part, upon modification of an ACPI BIOS Differentiated System Description Table in order to represent at least some of the claimed memory as being part of a root of a PCI bus hierarchy. In another example, identification of at least some of the claimed memory as residing on a PCI bus can be based, at least in part, upon a filter driver that modifies a resource requirement reported by a root PCI bus hierarchy to include at least some of the claimed memory. In yet another example, identification of at least some of the claimed memory as resident on a PCI bus is based, at least in part, upon modification of a BIOS description of memory.

At 530, a simulated PCI device is identified to an operating system (e.g., by a configuration space simulator 120). For example, identification of the simulated PCI device to the operating system can be based, at least in part, upon simulation of contents of PCI configuration space associated with the simulated PCI device (e.g., simulation of contents of PCI configuration space can include populating at least one base register with an address associated with the claimed memory).

At 540, at least some of the claimed memory is employed as simulated memory-mapped I/O registers of the simulated PCI device. Next, at 550, a device driver associated with the simulated PCI device (e.g., device driver associated with simulated PCI device 420) is loaded. At 560, a thread that monitors the simulated memory-mapped I/O registers for a change in order to simulate behavior of the simulated PCI device is instantiated (e.g., a memory-mapped I/O space simulator 130). At 570, a thread that changes at least one of the simulated memory mapped I/O registers in order to simulate behavior of the simulated PCI device is instantiated (e.g., a memory-mapped I/O space simulator 130).

Turning to FIG. 6, a method for a PCI device simulation 600 in accordance with an aspect of the present invention is illustrated. At 610, a device driver associated with the simulated PCI device (e.g., device driver associated with simulated PCI device 420) is loaded. At 620, a thread that monitors the simulated memory-mapped I/O registers for a change in order to simulate behavior of the simulated PCI device is instantiated (e.g., a memory-mapped I/O space simulator 130). At 630, a thread that changes at least one of the simulated memory mapped I/O registers in order to simulate behavior of the simulated PCI device is instantiated (e.g., a memory-mapped I/O space simulator 130).

Figure 7:
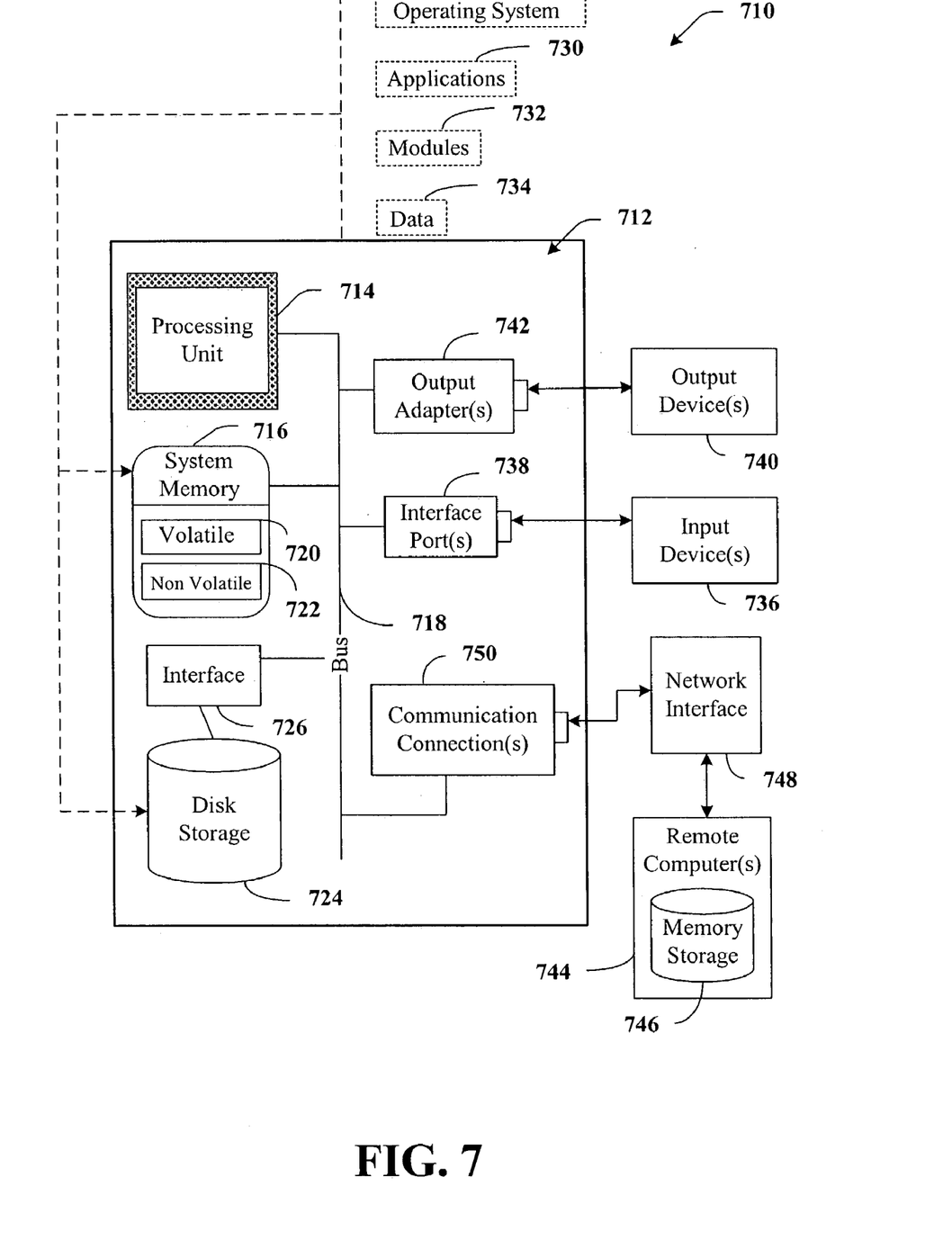
FIG. 7 illustrates an example operating environment in which the present invention may function.

In order to provide additional context for various aspects of the present invention, FIG. 7 and the following discussion are intended to provide a brief, general description of a suitable operating environment 710 in which various aspects of the present invention may be implemented. While the invention is described in the general context of computer-executable instructions, such as program modules, executed by one or more computers or other devices, those skilled in the art will recognize that the invention can also be implemented in combination with other program modules and/or as a combination of hardware and software. Generally, however, program modules include routines, programs, objects, components, data structures, etc. that perform particular tasks or implement particular data types. The operating environment 710 is only one example of a suitable operating environment and is not intended to suggest any limitation as to the scope of use or functionality of the invention. Other well known computer systems, environments, and/or configurations that may be suitable for use with the invention include but are not limited to, personal computers, hand-held or laptop devices, multiprocessor systems, microprocessor-based systems, programmable consumer electronics, network PCs, minicomputers, mainframe computers, distributed computing environments that include the above systems or devices, and the like.

With reference to FIG. 7, an exemplary environment 710 for implementing various aspects of the invention includes a computer 712. The computer 712 includes a processing unit 714, a system memory 716, and a system bus 718. The system bus 718 couples system components including, but not limited to, the system memory 716 to the processing unit 714. The processing unit 714 can be any of various available processors. Dual microprocessors and other multiprocessor architectures also can be employed as the processing unit 714.

The system bus 718 can be any of several types of bus structure(s) including the memory bus or memory controller, a peripheral bus or external bus, and/or a local bus using any variety of available bus architectures including, but not limited to, an 8-bit bus, Industrial Standard Architecture (ISA), Micro-Channel Architecture (MSA), Extended ISA (EISA), Intelligent Drive Electronics (IDE), VESALocal Bus (VLB), Peripheral Component Interconnect (PCI), Universal Serial Bus (USB), Advanced Graphics Port (AGP), Personal Computer Memory Card International Association bus (PCMCIA), and Small Computer Systems Interface (SCSI).

The system memory 716 includes volatile memory 720 and nonvolatile memory 722. The basic input/output system (BIOS), containing the basic routines to transfer information between elements within the computer 712, such as during start-up, is stored in nonvolatile memory 722. By way of illustration, and not limitation, nonvolatile memory 722 can include read only memory (ROM), programmable ROM (PROM), electrically programmable ROM (EPROM), electrically erasable ROM (EEPROM), or flash memory. Volatile memory 720 includes random access memory (RAM), which acts as external cache memory. By way of illustration and not limitation, RAM is available in many forms such as synchronous RAM (SRAM), dynamic RAM (DRAM), synchronous DRAM (SDRAM), double data rate SDRAM (DDR SDRAM), enhanced SDRAM (ESDRAM), Synchlink DRAM (SLDRAM), and direct Rambus RAM (DRRAM).

Computer 712 also includes removable/nonremovable, volatile/nonvolatile computer storage media. FIG. 7 illustrates, for example a disk storage 724. Disk storage 724 includes, but is not limited to, devices like a magnetic disk drive, floppy disk drive, tape drive, Jaz drive, Zip drive, LS-100 drive, flash memory card, or memory stick. In addition, disk storage 724 can include storage media separately or in combination with other storage media including, but not limited to, an optical disk drive such as a compact disk ROM device (CD-ROM), CD recordable drive (CD-R Drive), CD rewritable drive (CD-RW Drive) or a digital versatile disk ROM drive (DVD-ROM). To facilitate connection of the disk storage devices 724 to the system bus 718, a removable or non-removable interface is typically used such as interface 726.

It is to be appreciated that FIG. 7 describes software that acts as an intermediary between users and the basic computer resources described in suitable operating environment 710. Such software includes an operating system 728. Operating system 728, which can be stored on disk storage 724, acts to control and allocate resources of the computer system 712. System applications 730 take advantage of the management of resources by operating system 728 through program modules 732 and program data 734 stored either in system memory 716 or on disk storage 724. It is to be appreciated that the present invention can be implemented with various operating systems or combinations of operating systems.

A user enters commands or information into the computer 712 through input device(s) 736. Input devices 736 include, but are not limited to, a pointing device such as a mouse, trackball, stylus, touch pad, keyboard, microphone, joystick, game pad, satellite dish, scanner, TV tuner card, digital camera, digital video camera, web camera, and the like. These and other input devices connect to the processing unit 714 through the system bus 718 via interface port(s) 738. Interface port(s) 738 include, for example, a serial port, a parallel port, a game port, and a universal serial bus (USB). Output device(s) 740 use some of the same type of ports as input device(s) 736. Thus, for example, a USB port may be used to provide input to computer 712, and to output information from computer 712 to an output device 740. Output adapter 742 is provided to illustrate that there are some output devices 740 like monitors, speakers, and printers among other output devices 740 that require special adapters. The output adapters 742 include, by way of illustration and not limitation, video and sound cards that provide a means of connection between the output device 740 and the system bus 718. It should be noted that other devices and/or systems of devices provide both input and output capabilities such as remote computer(s) 744.

Computer 712 can operate in a networked environment using logical connections to one or more remote computers, such as remote computer(s) 744. The remote computer(s) 744 can be a personal computer, a server, a router, a network PC, a workstation, a microprocessor based appliance, a peer device or other common network node and the like, and typically includes many or all of the elements described relative to computer 712. For purposes of brevity, only a memory storage device 746 is illustrated with remote computer(s) 744. Remote computer(s) 744 is logically connected to computer 712 through a network interface 748 and then physically connected via communication connection 750. Network interface 748 encompasses communication networks such as local-area networks (LAN) and wide-area networks (WAN). LAN technologies include Fiber Distributed Data Interface (FDDI), Copper Distributed Data Interface (CDDI), Ethernet/IEEE 802.3, Token Ring/IEEE 802.5 and the like. WAN technologies include, but are not limited to, point-to-point links, circuit switching networks like Integrated Services Digital Networks (ISDN) and variations thereon, packet switching networks, and Digital Subscriber Lines (DSL).

Communication connection(s) 750 refers to the hardware/software employed to connect the network interface 748 to the bus 718. While communication connection 750 is shown for illustrative clarity inside computer 712, it can also be external to computer 712. The hardware/software necessary for connection to the network interface 748 includes, for exemplary purposes only, internal and external technologies such as, modems including regular telephone grade modems, cable modems and DSL modems, ISDN adapters, and Ethernet cards.

What has been described above includes examples of the present invention. It is, of course, not possible to describe every conceivable combination of components or methodologies for purposes of describing the present invention, but one of ordinary skill in the art may recognize that many further combinations and permutations of the present invention are possible. Accordingly, the present invention is intended to embrace all such alterations, modifications and variations that fall within the spirit and scope of the appended claims. Furthermore, to the extent that the term "includes" is used in either the detailed description or the claims, such term is intended to be inclusive in a manner similar to the term "comprising" as "comprising" is interpreted when employed as a transitional word in a claim.

What is claimed is:

1. A PCI simulation component comprising:
a computer processor and memory that executes and holds the following computer components:
a memory-mapped I/O space simulator that simulates behavior of a simulated PCI device;
an initialization component that claims an amount of memory and identifies at least some of the claimed memory as residing on a PCI bus; and,
a configuration space simulator that identifies the simulated PCI device to an operating system;
wherein the initialization component claims an amount of memory by reducing an amount of memory available to the operating system, at least one of the configuration space simulator and the memory-mapped I/O space simulator utilizing at least some of the claimed memory; and
wherein identification of at least some of the claimed memory as residing on a PCI bus being based upon modification of an ACPI BIOS Differentiated System Description Table in order to represent at least some of the claimed memory as being part of a root of a PCI bus hierarchy.

2. The PCI simulation component of claim 1, identification of the simulated PCI device to the operating system being based upon simulation of contents of PCI configuration space associated with the simulated PCI device.

3. The PCI simulation component of claim 2, simulation of contents of PCI configuration space including populating at least one base register with an address associated with the claimed memory.

4. The PCI simulation component of claim 1, identification of at least some of the claimed memory as residing on a PCI bus being based upon a filter driver that modifies a resource requirement reported by a root PCI bus hierarchy to include at least some of the claimed memory.

5. The PCI simulation component of claim 1, identification of at least some of the claimed memory as resident on a PCI bus being based upon modification of a BIOS description of memory.

6. The PCI simulation component of claim 1, identification of at least some of the claimed memory as resident on a PCI bus being based upon modification of the memory that the operating system uses by passing arguments to a kernel of the operating system.

7. The PCI simulation component of claim 1, at least some of the claimed memory acting as a simulated memory-mapped I/O register of the simulated PCI device.

8. The PCI simulation component of claim 7, the memory-mapped I/O space simulator further comprising a thread that monitors the simulated memory-mapped I/O registers for a change in order to simulate behavior of the simulated PCI device.

9. The PCI simulation component of claim 7, the memory-mapped I/O space simulator further comprising a thread that changes at least one of the simulated memory mapped I/O registers in order to simulate behavior of the simulated PCI device.

10. A PCI simulation system comprising:
an operating system; and
memory that executes and holds the following computer components:
a PCI simulation component comprising a memory-mapped I/O space simulator that simulates behavior of a simulated PCI device, an initialization component that claims an amount of the memory, and, identifies at least some of the claimed memory as residing on a PCI bus, and, a configuration space simulator that identifies the simulated PCI device to the operating system;
wherein the initialization component claims an amount of memory by reducing an amount of memory available to the operating system, at least one of the configuration space simulator and the memory-mapped I/O space simulator utilizing at least some of the claimed memory; and
wherein identification of at least some of the claimed memory as residing on a PCI bus being based upon a filter driver that modifies a resource requirement reported by a root PCI bus hierarchy to include at least some of the claimed memory.

11. The system of claim 10, further comprising a device driver associated with the simulated PCI device.

12. A method of simulation of a PCI device's memory-mapped I/O registers comprising:
executing on a computer processor the following computer executable acts, comprising:
claiming an amount of memory;
identifying the claimed memory as residing on a PCI bus;
identifying a simulated PCI device to an operating system; and,
employing the claimed memory as simulated memory-mapped I/O registers of the simulated PCI device;
wherein identification of the claimed memory as residing on a PCI bus being based upon modification of an ACPI BIOS Differentiated System Description Table in order to represent the claimed memory as being part of a root of a PCI bus hierarchy.

13. The method of claim 12, further comprising at least one of the following acts:
instantiating a thread that monitors the simulated memory-mapped I/O registers for a change in order to simulate behavior of the simulated PCI device,
instantiating a thread that changes at least one of the simulated memory mapped I/O registers in order to simulate behavior of the simulated PCI device; and,
loading a device driver associated with the simulated PCI device.

14. The method of claim 12, identification of the simulated PCI device to the operating system being based upon simulation of contents of PCI configuration space associated with the simulated PCI device.

15. The method of claim 14, simulation of contents of PCI configuration space including populating at least one base register with an address associated with the claimed memory.

16. The method of claim 12, claiming an amount of memory including reducing an amount of memory available to the operating system.

17. The method of claim 12, identification of at least some of the claimed memory as residing on a PCI bus being based upon a filter driver that modifies a resource requirement reported by a root PCI bus hierarchy to include at least some of the claimed memory.

18. The method of claim 12, identification of at least some of the claimed memory as resident on a PCI bus being based upon modification of a BIOS description of memory.

19. A PCI simulation component comprising:
computer implemented means for simulating behavior of a simulated PCI device;
computer implemented means for claiming an amount of memory;
computer implemented means for identifying at least some of the claimed memory as residing on a PCI bus; and,
computer implemented means for identifying the simulated PCI device to an operating system, wherein identification of at least some of the claimed memory as residing on a PCI bus being based upon modification of an ACPI BIOS Differentiated System Description Table in order to represent at least some of the claimed memory as being part of a root of a PCI bus hierarchy.

* * * * *